Nov. 6, 1956

J. CHESNEY 2,769,961

HIGH FREQUENCY INTERSTAGE COUPLING

Filed Dec. 18, 1953

INVENTOR

JOHN CHESNEY

BY James and Franklin

ATTORNEYS

United States Patent Office 2,769,961
Patented Nov. 6, 1956

2,769,961

HIGH FREQUENCY INTERSTAGE COUPLING

John Chesney, Roselle Park, N. J., assignor to General Instrument Corporation, Elizabeth, N. J., a corporation of New Jersey Application December 18, 1953, Serial No. 398,940

10 Claims. (Cl. 333—24)

The present invention relates to a structure by means of which two stages of a high frequency tuning unit, such as one empolyed in a television set, may be electrically coupled, and is particularly adapted for use in a unit the various stages of which are adapted to be tuned by the simultaneous rotation of individual tuning elements for each stage, the elements being mounted on a common shaft.

It has long been known that adjacent stages of high frequency tuning units may be electrically coupled by means of a conductive loop extending physically into each of the adjacent stages. The positioning of such a loop on the tuning structure requires a manual operation solely on its own behalf, thus adding to the expense of the unit. In addition, since the precise position of the coupling loop relative to the tuned elements in the respective stages is rather critical, problems of adjustment and maintenance are presented which further complicate and prolong the process of manufacture and assembly.

According to the present invention coupling between a pair of adjacent stages in a tuning unit is accomplished without having to use any special structural element which exclusively serves that purpose. Instead, an element otherwise necessary for the proper functioning of the unit and performing a known and conventional function is modified so as to electrically couple as well as perform its previous function. Moreover, the nature of this element, now performing a dual function, is such that its physical position with respect to the stages which it electrically couples is rigidly fixed, thus producing a coupling effect which is reliably uniform in all units, even those made on a production line basis.

The necessity for maintaining the various sets of rotor plates of a rotary variable condenser at a common potential, usually ground potential, the several sets of rotor plates being used in conjunction with cooperating stator plate sets for tuning individual stages, has long been known. The individual stages are conventionally separated by conductive plates which act as shields between them, these shields are all maintained at the same potential, and it is a common expedient to mount resilient conductive wipers on these shielding plates, the wipers engaging and wiping over the conductive rotor shaft on which the rotor plates are conductively mounted as that shaft is rotated. I have found that by suitably modifying the design of these conductive wipers, and more specifically by forming them into the shape of a loop which not only engages and wipes over the rotor shaft but also freely passes through the shielding plate from one stage into another, they will not only perform their old and known wiping function, but will also serve to electrically couple the stages into which the loop extends. Because the loop engages shoulders formed on the rotor shaft, as is customary with respect to their previous known wiping function, and because the rotor shaft is necessarily rigidly axially positioned within the tuning unit, being permitted only rotary motion, the position of those portions of the loop which produce the electrical coupling is also rigidly controlled, thus giving rise to reliability and reproducibility of the coupling effect produced thereby, both initially and during long extended use.

To the accomplishment of the above, and to such other objects as may hereinafter appear, the present invention relates to a coupling structure as defined in the appended claims and as described in this specification, taken together with the accompanying drawings, in which:

Figure 1:
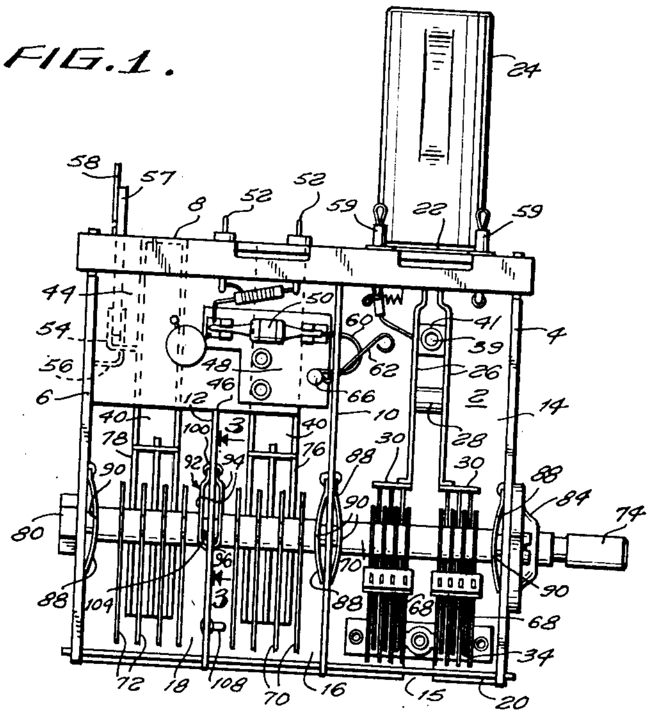
Fig. 1 is a top plan view of a television tuning unit embodying the present invention.

The tuning unit, as here disclosed, comprises a chassis defined by a bottom wall 2 and front and rear walls 4 and 6, a cover plate 8 being secured thereto to close one end thereof. Partitions 10 and 12 extend from the cover plate 8 to the other and open end 15 of the unit, these partitions dividing the unit into spaces 14, 16 and 18 respectively. The free ends of the partitions 10 and 12 are fixed by means of a tie bar 20 which extends across the open end 15 of the unit and is secured to the walls 4 and 6 respectively. All of the elements thus far described are conductive and are intimately and conductively connected to one another. These chassis parts are adapted to be maintained at a potential which may be considered as ground potential in an electric circuit.

A socket 22 is mounted on the cover 8 in line with the space 14, and a shielded electron tube 24 is adapted to be received therein. A pair of spaced conductive plates electrically separated but physically held together by the member 28, are electrically connected to appropriate terminals of the tube 24 and extend into and along the space 14 from the cover 8, being spaced from the walls 2, 4 and 10 and carrying stator plate assemblies 30 at their free ends, those assemblies being supported above the wall 2 by means of insulating posts 32. A pair of concentric lines are defined thereby, the common outer conductor comprising the walls 2, 4 and 10 and the inner conductors comprising the members 26 and the respective stator plate assemblies 30 connected thereto. This coaxial line will normally have a resonant frequency determined by its dimensions and by the capacitive coupling between the spaced ends of the line at the open end 15 of the unit. The physical dimensions are fixed, but the capacitive coupling may be adjusted by what is essentially a trimmer condenser, one set of condenser plates being defined by the stator plates 30 and the other being defined by the conductive vane 34 mounted on shaft 36 which is adjustably rotatable on and conductively connected to conductive bracket 38 secured to the bottom wall 2, the plates 30 thus being electrically a part of the inner conductor and the vane 34 thus being electrically a part of the outer conductor of the thus defined concentric line. The coupling between the inner conductors 26 may be adjusted by positioning a conductive core 39 along an insulating tube 41 positioned between the inner ends of the members 26.

In the spaces 16 and 18 substantially U-shaped conductive members 40 are mounted in cantilever fashion on the cover 8 and extend along the spaces 16 and 18 respectively to points adjacent the open end 15 of the unit, being spaced from the walls 2, 10 and 12 and 2, 6 and 12 respectively so as to define, with those walls, concentric lines. The capacitive coupling between the free ends of the lines may be adjusted by means of bendable tabs 42 secured to the bottom wall 14 and extending up, under and along and spaced from the lower surfaces of the members 40.

A platform 44 of conductive material extends across the spaces 16 and 18 adjacent the cover 8, the wall 12 being recessed at 46 to permit the platform 44 to be spaced well below the level of the exposed edges of the walls 4 and 6, an insulating plate 48 is mounted thereon, and various electrical components including a subminiature tube 50 are mounted and make connection with external terminals 52.

The unit as above described comprises a plurality of stages. The input or antenna line, which is a two-wire line, may be coupled to the first radio frequency stage defined by the coaxial line in the space 18 by means of a pair of conductive strips 54 and 56 connected at one end respectively to the inner conductor 40 and the wall 6 which is a part of the outer conductor, those strips 54 and 56 being mounted on an insulating plate 57, passing through the cover 8 and being connected to terminals 58 extending therefrom. The coaxial line in the space 16 defines a second radio frequency section. The circuitry on the platform 44 defines part of an oscillator circuit and the concentric line within the space 14 is adapted to be coupled both to said oscillator circuit part and to the second radio frequency stage of space 16 so as to function as a mixing and detecting stage the output of which is amplified by the tube 34 and led off through terminals 59.

Coupling between the oscillator circuit on the platform 44 and the concentric line in the space 14 is accomplished by means of loop 60 which extends through an appropriate opening in the shielding wall 10. Coupling between the second radio frequency stage in the space 16 and the concentric line in the space 14 is accomplished by means of a projecting wire 62 which is electrically connected to a bar 64 the lower end of which is secured to and extends forwardly from the cover 8 and the body of which extends upwardly in the space 16 between the U-shaped member 40 and the wall 10 to the terminal 66. The coupling between the two radio frequency stages in the spaces 16 and 18, which is the basic subject matter of the instant invention, will be described below.

In order to tune each of the stages and thus cause them to resonate at a desired frequency corresponding to the channel to be received, sets of condenser rotor plates 68, 70 and 72 are provided, all conductively mounted on a unitary conductive rotor shaft 74. The rotor plate sets 68 cooperate with the stator plate sets 30 in the space 14, the rotor plate set 70 cooperates with the stator plate set 76 mounted at the end of the U-shaped member 40 within the space 16, and the rotor plate set 72 cooperates with the stator plate set 78 mounted at the end of the U-shaped member 40 within the space 18. The rotor shaft 74 is mounted in the chassis in a manner conventional in rotary variable condensers, the left hand end thereof engaging an anti-friction thrust bearing 80 mounted on the wall 6 and the right hand end thereof extending out through an anti-friction bearing 84 mounted on the wall 4. In order to permit the shaft 74, together with its associated rotor plates, to be conveniently mounted within the chassis, the front wall 4 and the intermediate walls 10 and 12 are provided with slots 86 and 86′ extending inwardly from the open end 15 of the chassis, those slots being wider than the diameter of the shaft 74 so that no electrical contact is made therewith. In order that the rotor plates and the rotor shaft 74 may be maintained at ground potential, or, in other words, at the potential of the outer conductors of the concentric lines defined in each of the spaces 14, 16 and 18, conventional resilient wipers are employed on each of the walls 4, 10 and 6, those wipers taking the form of bifurcated bowed resilient conductive elements 88 conductively and physically secured to their respective walls and engaging shoulders 90 formed on the shaft by reducing the diameter thereof.

Figures 2, 3, 4:
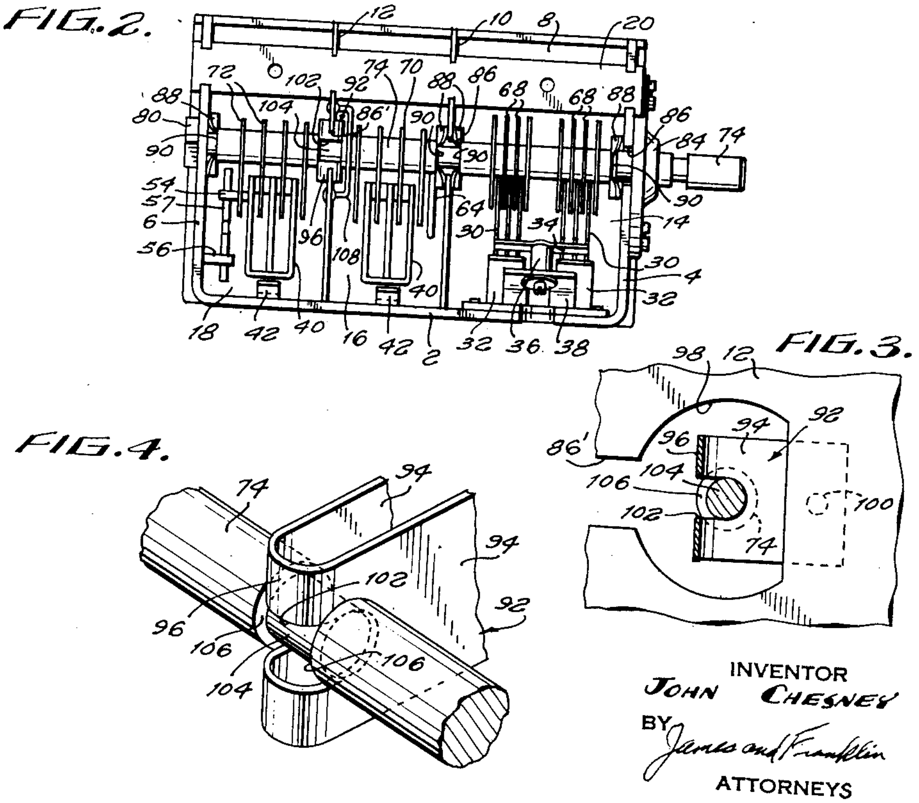
Fig. 2 is a side elevational view thereof.
Fig. 3 is a detail cross sectional view taken along the line 3—3 of Fig. 1.
Fig. 4 is a detail three-quarter perspective view of the structure shown in Fig. 3.

The wiping structure attached to the wall 12 which defines a partition and shield between the spaces 16 and 18 is not of conventional nature, and it is this structure which provides for electrical coupling between the two radio frequency stages defined within the spaces 16 and 18. It comprises, as here disclosed, a substantially U-shaped structure 92 formed of resilient conductive material and defined by two legs 94 and a cross piece 96. The legs 94 are spaced from and are positioned on opposite sides of the wall 12 in line with the slot 86′ in the wall 12, that slot having an enlarged inner part 98 which may best be seen in Fig. 3. The ends of the legs 94 remote from the cross piece 96 are physically and conductively secured to the wall 12 at 100. The ends of the legs 94 adjacent the cross-piece 96 extend partially over the enlarged slot part 98 and the cross-piece 96 passes through the enlarged slot part 98 without making contact or electrical connection therewith. The cross-piece 96 and the portions of the legs 94 immediately adjacent thereto are provided with a slot 102 in line with the slot 86′ in the wall 12 but having a lesser width, preferably corresponding to the diameter of a reduced portion 104 of the rotor shaft 74, which is adapted to be snugly received therein. The reduced shaft portion 104 produces shoulders 106 on the shaft 74 with which the legs 94 resiliently engage.

The element 92 therefore functions in a manner comparable to the conventional wiper elements 88, making electrical contact with the rotor shaft 74 as it rotates and ensuring that the shaft 74 and the rotor plates 70 and 72 are maintained at the proper potential. In addition, because the member 92 passes freely through the enlarged slot portion 98, it defines a loop one leg 94 of which is in the space 16 and the other leg 94 of which is in the space 18. It therefore also functions to electrically couple the concentric lines defined within the spaces 16 and 18 at the radio frequencies involved. Because the axial position of the shaft 74 is necessarily fixed, and because the legs 94 of the member 92 positively engage the shoulders 106 on the shaft 74, the degree to which those legs 94 extend into the spaces 16 and 18 respectively is positively limited, and consequently the character of the coupling is closely controlled and will not vary appreciably from one unit to another, even when mass production methods are employed in manufacture and assembly. Since wipers electrically connected between the wall 12 and the rotor shaft 74 would have had to be employed in any event, it will be appreciated that electrical coupling between the spaces 16 and 18 has been accomplished without having to employ any special structural element.

It is preferred that a conductive bar 108 be electrically and physically connected between portions of the wall 12 above and below the slot 86′ and between the member 92 and the open end 15 of the unit. It has been found that such a bar, which constitutes a short circuit across the slot 86′, assists in the shielding between the spaces 16 and 18, thus rendering the action of the coupling member 92 more positive, and also prevents any detuning effect when, as is customary, a metallic conductive cover is placed over the chassis so as to close the open top and the open end 15 thereof.

While but a single embodiment of the present invention has been here disclosed, it will be apparent that many variations may be made therein, within the scope of the present invention as defined in the following claims.

I claim:

1. In a tuning unit comprising a pair of stages separated by a conductive wall having at least one opening therethrough, said stages being tuned by the simultaneous rotation of tuning elements for each stage, said elements being mounted on a common shaft passing through an opening in and spaced from said wall; a combined coupling and shaft-contacting element comprising a pair of wiper segments, one on each side of said wall, one end of each of the said segments being conductively secured to said wall, the other ends of said segments being conductively connected by a member separate from said shaft which passes through and is spaced from an opening in said wall, said segments engaging said shaft and wiping thereover as said shaft is rotated.

2. The tuning unit of claim 1, in which said connecting member passes through the same opening in said wall as said shaft and is spaced from said shaft.

3. In a tuning unit comprising a pair of stages separated by a conductive wall having at least one opening therethrough, said stages being tuned by the simultaneous rotation of tuning elements for each stage, said elements being mounted on a common shaft passing through an opening in and spaced from said wall; a combined coupling and shaft-contacting element comprising a substantially U-shaped structure formed of resilient conductive material and defined by two legs and a cross-piece, said legs being positioned spaced from and on opposite sides of said wall, the ends of said legs being conductively secured to said wall, said cross-piece passing through and being spaced from an opening in said wall, said legs resiliently engaging said shaft and wiping thereover as said shaft is rotated.

4. The tuning unit of claim 3, in which said cross-piece passes through the same opening in said wall as said shaft and is spaced from said shaft.

5. In a tuning unit comprising a pair of stages separated by a conductive wall and tuned by the simultaneous rotation of tuning elements for each stage, said elements being mounted on a common shaft passing through an opening in and spaced from said wall; the improvement which comprises said wall having a slot extending inwardly from one edge thereof through which a portion of said shaft of reduced diameter is adapted to pass without making contact with said wall, thereby defining said aforementioned opening, said reduced diameter shaft portion defining shoulders at either end thereof, one on each side of said wall, in combination with a combined coupling and shaft-contacting element comprising a pair of wiper segments, one on each side of said wall and spaced therefrom except where one end of each is conductively secured to said wall, said segments respectively slidably engaging one of the shoulders on said shaft so as to wipe thereover as said shaft is rotated, and a member separate from said shaft passing through said slot without making contact with said wall and conductively connecting the other ends of said segments.

6. In the tuning unit of claim 5, a conductive element connected between portions of said wall so as to bridge said slot and positioned between said coupling element and said edge of said wall.

7. In a tuning unit comprising a pair of stages separated by a conductive wall and tuned by the simultaneous rotation of tuning elements for each stage, said elements being mounted on a common shaft passing through an opening in and spaced from said wall; the improvement which comprises said wall having a slot extending inwardly from one edge thereof and having an enlarged inner part through which a portion of said shaft of reduced diameter is adapted to pass without making contact with said wall, thereby defining said aforementioned opening, said reduced diameter shaft portion defining shoulders at either end thereof, one on each side of said wall, in combination with a combined coupling and shaft-contacting element comprising a substantially U-shaped structure formed of resilient conductive material and defined by two legs and a cross-piece, said legs being positioned spaced from and on opposite sides of said wall in line with said slot and partially extending over said enlarged inner slot part, the ends of said legs being conductively secured to said wall, said cross-piece passing through said enlarged inner part slot without making contact with said wall, said cross-piece and the portions of said legs adjacent thereto having a second slot formed therein into which said reduced diameter shaft portion is snugly received, said legs respectively resiliently slidably engaging one of the shoulders on said shaft so as to wipe thereover as said shaft is rotated.

8. In the tuning unit of claim 7, a conductive element connected between portions of said wall so as to bridge said slot and positioned between said coupling element and said edge of said wall.

9. In a tuning unit comprising a pair of stages seperated by a conductive wall and tuned by the simultaneous rotation of tuning elements for each stage, said elements being mounted on a common shaft passing through an opening in and spaced from said wall; the improvement which comprises said wall having a slot extending inwardly from one edge thereof and having an inner part through which a portion of said shaft of reduced diameter is adapted to pass without making contact with said wall, thereby defining said aforementioned opening, said reduced diameter shaft portion defining shoulders at either end thereof, one on each side of said wall, in combination with a combined coupling and shaft-contacting element comprising a substantially U-shaped structure formed of resilient conductive material and defined by two legs and a cross-piece, said legs being positioned spaced from and on opposite sides of said wall in line with said slot and partially extending over said inner slot part, the ends of said legs being conductively secured to said wall, said cross-piece passing through said inner slot part without making contact with said wall, said cross-piece and the portions of said legs adjacent thereto having a second slot formed therein into which said reduced diameter shaft portion is snugly received, said legs respectively resiliently slidably engaging one of the shoulders on said shaft so as to wipe thereover as said shaft is rotated.

10. In the tuning unit of claim 9, a conductive element connected between portions of said wall so as to bridge said slot and positioned between said coupling element and said edge of said wall.

References Cited in the file of this patent

UNITED STATES PATENTS

| | | |
|---|---|---|
| 1,917,487 | Bennett et al. | July 11, 1933 |
| 1,968,772 | Kenney | July 31, 1934 |